United States Patent [19]

Husher

[11] Patent Number: 5,412,527
[45] Date of Patent: May 2, 1995

[54] ELECTROSTATIC DISCHARGE PROTECTION CIRCUIT

[75] Inventor: John D. Husher, Los Altos, Calif.

[73] Assignee: Micrel, Incorporated, San Jose, Calif.

[21] Appl. No.: 71,149

[22] Filed: Jun. 2, 1993

[51] Int. Cl.[6] .................................. H02H 9/04
[52] U.S. Cl. ............................. 361/56; 361/91; 361/111; 361/118
[58] Field of Search ............... 361/56, 91, 111, 118; 357/42

[56] References Cited

U.S. PATENT DOCUMENTS 4,513,309  4/1985  Cricchi ................... 357/42
4,930,036  5/1990  Sitch .................... 361/56

Primary Examiner—Marc S. Hoff
Assistant Examiner—S. Jackson
Attorney, Agent, or Firm—Skjerven, Morrill, MacPherson, Franklin & Friel; Brian D. Ogonowsky

[57] ABSTRACT

A circuit which protects against damage to an integrated circuit caused by electrostatic discharge (ESD) includes a resistor connected at one end to an input pad, and a pair of back-to-back Schottky diodes connected to the other end of the resistor. The cathodes of the Schottky diodes are connected to each other by a common semiconductor substrate and connected to a supply voltage. The anode of one of the Schottky diodes is grounded, and the anode of the other Schottky diode is connected to a node in common with the other end of the resistor and a circuit component to be protected from an ESD spike. The Schottky diodes, when forward biased by an ESD spike, do not inject minority carriers into the substrate. In this way, unwanted PNP, NPN, or four-layer diode problems are avoided and recovery from an ESD spike is rapid.

6 Claims, 3 Drawing Sheets

ELECTROSTATIC DISCHARGE PROTECTION CIRCUIT

BACKGROUND OF THE INVENTION

1. Field of the Invention

This invention relates to circuits for protecting against damage to other circuits caused by electrostatic discharge.

2. Description of Related Art

Electrostatic discharge (ESD) is a well known concern when designing an integrated circuit (IC). ESD spikes coupled to an input pad of an IC can be several thousand volts and can destroy circuitry within an IC, especially field effect transistors (FETs). Accordingly, ICs frequently provide some sort of protection circuit for preventing high voltage ESD spikes applied to input pads from reaching internal devices.

One example of a prior art circuit for protecting against electrostatic discharge is shown in FIG. 1. In the example of FIG. 1, if a positive electrostatic spike is applied to input pad 12, the spike is shunted to the positive power supply terminal 14 through PN junction diode D1 so that the maximum voltage appearing at node 10 is approximately the supply voltage plus the diode drop (e.g., 0.7 volts) of diode D1. Resistor R1 connected between node 10 and input pad 12 limits the current through diode D1. If a negative spike is applied to input pad 12, the spike is shunted to ground through PN junction diode D2 so that the maximum voltage on node 10 is approximately −0.7 volts.

One problem with the circuit of FIG. 1 is that diodes D1 and D2 inject minority carrier into the substrate or region in which the diodes are formed. This may result in unwanted PNP action, NPN action, four-layer diode action, or residual charges being trapped in the substrate or region. The injected minority carriers continue to affect the operation of the IC until the charges drain off. The injection of minority carriers can also cause latch-up of devices formed in the substrate.

Another problem with the circuit of FIG. 1 is that the protection circuit generally must be connected to the supply voltage $V_{cc}$ in order to protect against ESD. Therefore, the protection circuit does not operate when $V_{cc}$ is not connected, such as when the IC is being handled out of its socket.

The above prior art approach and similar prior art approaches require one or two PN (or NP) junctions to be formed prior to a metallization step, which electrically contacts the various surface regions. However, in some technologies, forming a suitable PN (or NP) junction requires extra masking and diffusion steps. In some cases, two additional diffusions are required to form PN or NP junctions while attempting to minimize minority carrier injection into the substrate or to minimize any PNP, NPN, or four-layer diode problem.

There is a need for a circuit that protects against positive and negative ESD, that does not inject minority carriers into a substrate or region, that is simple to fabricate, that takes up little silicon surface area, and that protects against ESD even when not connected to a power supply.

SUMMARY OF THE INVENTION

A circuit which protects against damage caused by electrostatic discharge (ESD) includes a resistor connected at one end to an input pin of an IC, and a pair of back-to-back Schottky diodes connected to the other end of the resistor. The cathodes of the Schottky diodes are connected to each other and to a supply voltage $V_{cc}$. The anode of one of the Schottky diodes is grounded to a reference voltage $V_{ss}$, and the anode of the other Schottky diode is connected to a node which is common to the input resistor and to a circuit component, such as the gate of an FET, to be protected from damage. A specific implementation of the circuit in silicon is shown which makes use of the desirable properties of the Schottky diodes in the protection circuit.

Embodiments of the invention are easily constructed using bipolar, BCD, DMOS, BiCMOS, or CMOS technologies, and provide protection against positive and negative ESD spikes even when not connected to a supply voltage.

Through the use of Schottky diodes, the protection circuit does not inject minority carriers into a substrate, so there is no problem with charges being trapped in a substrate or region. There are, therefore, no lingering effects from an ESD spike.

The use of Schottky diodes also results in a space savings, and Schottky diodes are easy to form in virtually any technology without additional process steps.

Further, due to the relatively lower forward bias voltage drop of Schottky diodes, the turn-on of the Schottky diodes prevents forward biasing of PN junctions formed in the substrate and, thus, avoids undesired PNP, NPN, or four-layer diode effects.

Even when a protection circuit according to the invention is not connected to a power supply, gates of FETs are protected by the Schottky diodes bypassing the gate oxide.

DETAILED DESCRIPTION OF THE PREFERRED EMBODIMENTS

Figure 1:
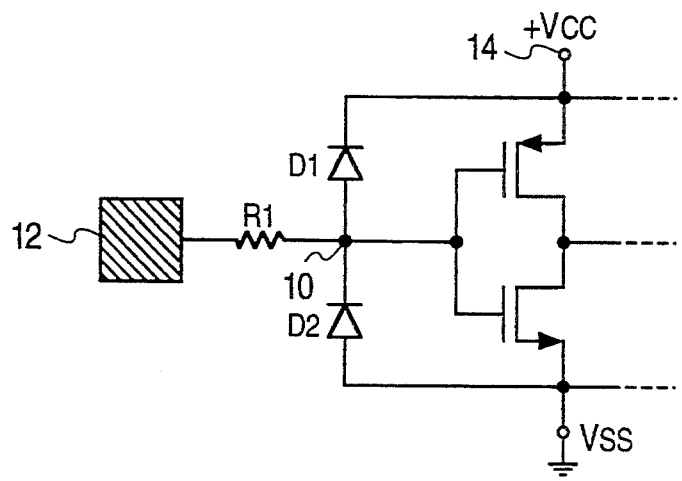
FIG. 1 is a schematic diagram of a prior art circuit for protecting against ESD.
Figure 2:
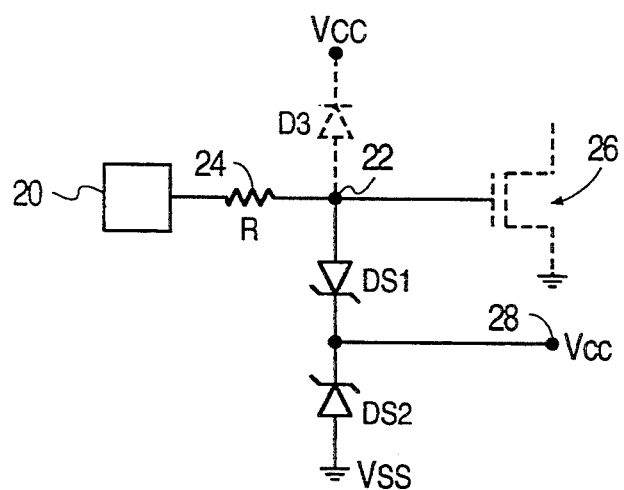
FIG. 2 is a schematic diagram of a circuit for protecting against ESD in accordance with the invention.

FIG. 2 is a schematic diagram of a circuit for protecting against ESD. In FIG. 2, an IC input pad 20, which may be subjected to an ESD spike, is connected to a node 22 by a resistor 24. Resistor 24 has a resistance R which is typically in the range from 1 K$\Omega$ to 1.5 K$\Omega$ to limit current and to provide an RC time constant to reduce the peak energy conducted. A circuit element to be protected, such a gate of an FET 26, connects to node 22.

Also connected to node 22 is the anode of a Schottky diode DS1. The cathode of the Schottky diode DS1 is connected to the cathode of a second Schottky diode DS2 and to a power supply terminal 28 providing voltage $V_{cc}$. The anode of diode DS2 is grounded to a reference potential $V_{ss}$.

The circuit shown protects against both positive and negative ESD spikes on input pad 20.

When input pad 20 is subjected to a positive ESD spike having a voltage $V_{ESD}$ which is higher than $V_{cc}$ plus the diode drop $V_D$ of diode DS1, diode DS1 conducts a current to the power supply through terminal 28. (A typical diode voltage drop $V_D$ of a Schottky diode is about 0.3 to 0.6 V.) The power supply is one which could absorb the spikes. The voltage at node 22, therefore, does not exceed $V_{cc}+V_D$, and the current flowing through resistor 24 is about I={$V_{ESD}-(V_{cc}+V_D)$}/R.

The PN junction diode D3, shown between node 22 and $V_{cc}$, is not turned on due to the lower forward biasing voltage of diode DS1. Diode D3 will be discussed later with respect to FIG. 3.

When input pad 20 is subjected to a negative ESD spike having a voltage $V_{ESD}$ which is lower than the breakdown voltage $V_{BV}$ (e.g., −25 volts) of diode DS1 minus the forward diode drop $V_D$ (e.g., 0.3 volts) of diode DS2, diodes DS1 and DS2 conduct a current from node 22 to ground. The voltage at node 22 is then approximately fixed at ($V_{BV}-V_D$), and the current flowing through resistor 24 is $$I=\{V_{ESD}-(V_{BV}-V_D)\}/R.$$

Thus, the protection circuit of FIG. 2 protects a downstream circuit from both positive and negative spikes.

Figure 3:
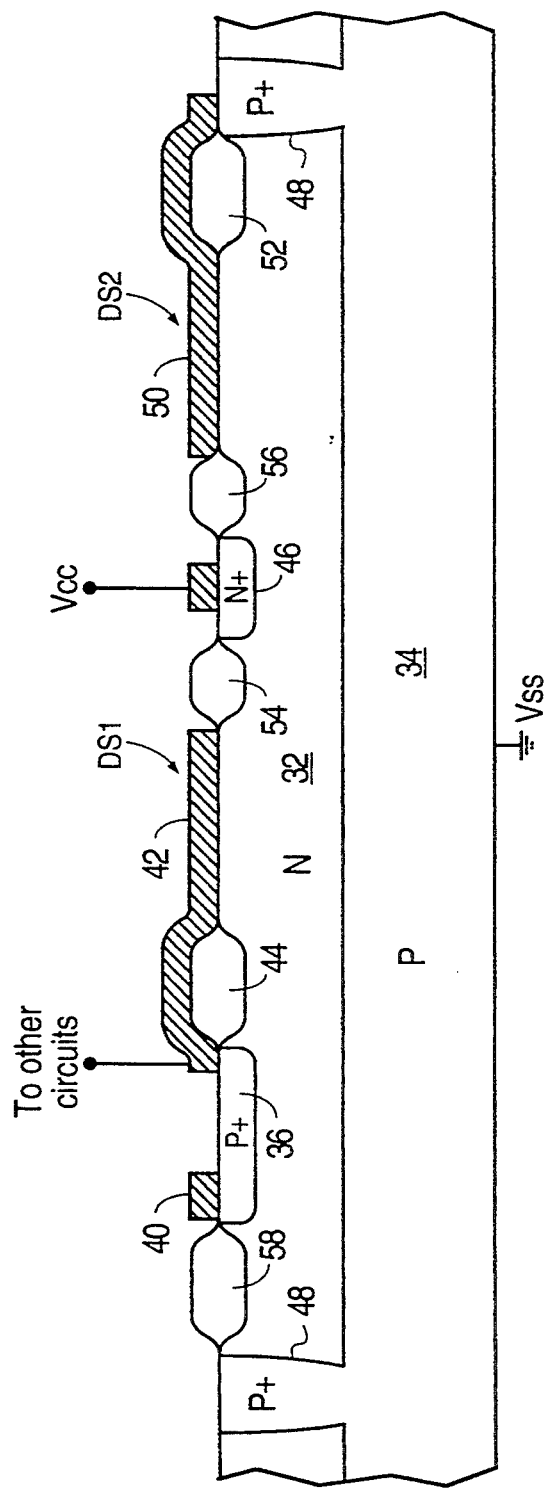
FIG. 3 is a cross-sectional view of an integrated circuit which implements the circuit of FIG. 2.

FIG. 3 is a cross-sectional view of an IC which implements the circuit of FIG. 2. In FIG. 3, a lightly doped N-type epitaxial layer 32 is formed over a P-type substrate 34. Epitaxial layer 32 preferably has a dopant concentration of less than about $1\times10^{17}/cm_3$ to enable the formation of Schottky diodes as described below. In another embodiment, epitaxial layer 32 may be deleted, and the substrate 34 can be made N-type.

A P-type resistor region 36 is formed in epitaxial layer 32 and serves as a resistor of a desired value. A metal terminal 40 makes ohmic contact to resistor region 36 and connects to an input pad, such as pad 20 in FIG. 2, which may be subjected to an ESD spike.

A Schottky metal portion 42, consisting of aluminum or an aluminum silicon mixture, ohmically contacts resistor region 36. Schottky metal portion 42 extends over an insulating oxide region 44 to separate the Schottky diode DS1 from the resistor region 36 junction.

Metal portion 42 contacts N-type epitaxial layer 32 and forms a first Schottky diode DS1.

A heavily doped N-type region 46 is formed in epitaxial layer 32 and is connected to the supply voltage $V_{cc}$ to bias epitaxial layer 32 to approximately the supply voltage $V_{cc}$.

Substrate 34 is grounded to the reference voltage $V_{ss}$.

Deep P+ isolation regions 48 are formed through epitaxial layer 32 to make electrical contact with substrate 34.

A second Schottky metal portion 50, consisting of aluminum or an aluminum silicon mixture, is formed over epitaxial layer 32 to form a second Schottky diode DS2. Metal portion 50 extends over oxide region 52 and makes ohmic contact with P+ isolation region 48.

The various oxide regions 44, 52, 54, 56, and 58 shown are formed before any doping or metal deposition steps. The methods used to grow the oxide regions, dope epitaxial layer 32, and deposit Schottky metal 42 and 50 are conventional.

The circuit elements shown in FIG. 2 correspond to the structures just described for FIG. 3 as follows. Input pad 20 in FIG. 2 connects to metal terminal 40. Resistor 24 in FIG. 2 corresponds to P-type resistor region 36.

Schottky diodes DS1 and DS2 in FIG. 2 correspond to diodes DS1 and DS2 in FIG. 3. Node 22 in FIG. 2 corresponds to the end portion of Schottky metal 42 contacting resistor region 36.

The PN junction diode D3 in FIG. 2 corresponds to the PN junction between resistor region 36 and epitaxial layer 32. Schottky diodes have a smaller voltage drop $V_D$ and a smaller breakdown voltage $V_{BV}$ than do conventional PN junction diodes. Accordingly, during a positive ESD spike conducted by terminal 40 and resistor region 36, Schottky diode DS1 turns on before diode D3 turns on. During a negative ESD spike, Schottky diode DS1 breaks down before diode D3. Accordingly, most of the current through resistor region 36 flows through diode DS1 rather than diode D3. Diode D3 is shown in dashed outline in FIG. 2 to convey that it never turns on.

When the protection circuit shown in FIGS. 2 or 3 is not connected to a supply or reference voltage (i.e., the IC chip is not plugged into a socket), the circuit still protects the gate oxide of FET 26 against damage caused by positive or negative ESD spikes since conduction by Schottky diode DS1 bypasses the gate oxide.

Importantly, during operation, any turning on of Schottky diodes DS1 and DS2 does not cause minority carriers to be injected into epitaxial layer 32, so there is no PNP, NPN, or four-layer diode turn-on and no residual charge in epitaxial layer 32 or substrate 34. Also, there are no lingering effects of an ESD spike.

There are no extra masking steps needed to form the protection circuit, since the Schottky diode areas can be opened during the contact opening step for all devices on the wafer followed by a conventional aluminum, aluminum/silicon, or aluminum/copper metallization step.

The protection circuit shown in FIG. 3 may be formed during processes used to form bipolar, BCD, DMOS, BiCMOS, and other devices. The present invention is equally applicable to CMOS metal gate or silicon gate circuits.

Figure 4:
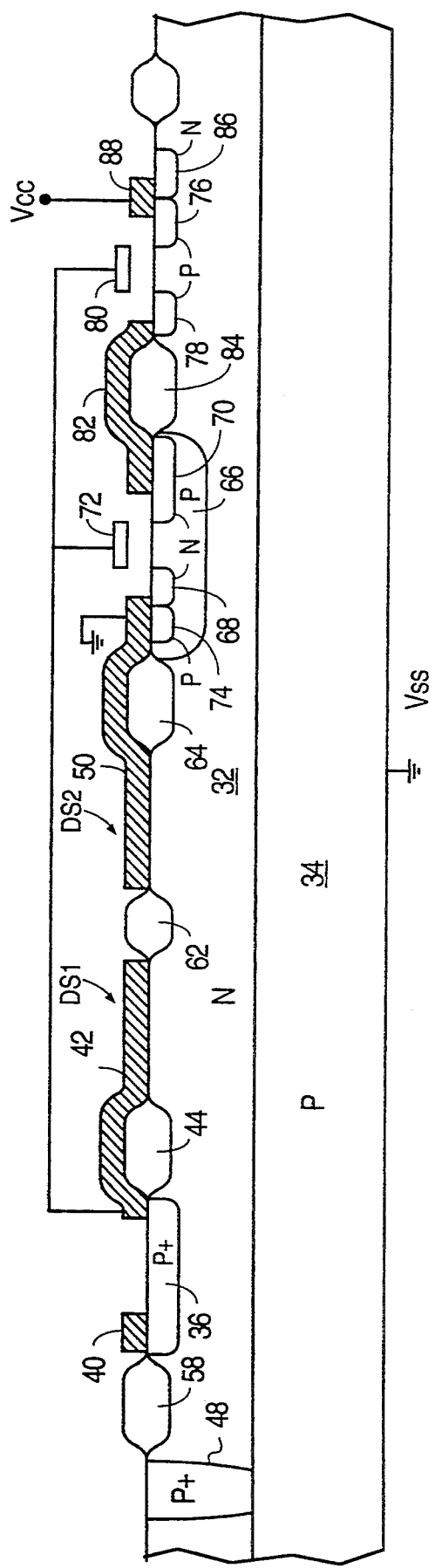
FIG. 4 is a cross-sectional view of an integrated circuit which implements the protection circuit of FIG. 2 and incorporates a CMOS device.

FIG. 4 is a cross-sectional view of an integrated circuit for protecting against ESD which is implemented using CMOS technology.

Elements in FIG. 4 which are similar to elements in FIG. 3 are labeled with the same numerals. If epitaxial layer 32 is not needed for a certain application, epitaxial layer 32 may be deleted, and substrate 34 can be made N-type. For example, if only CMOS devices are required to be formed, no epitaxial layer is needed. If BCD or BiCMOS devices are to be formed, then an epitaxial layer is usually needed.

Oxide 62 separates Schottky metal portions 42 and 50.

Oxide 64 provides some isolation between Schottky diode DS2 and P-well 66. In P-well 66 is formed an N-channel MOSFET comprising N-type source region 68 and N-type drain region 70. A gate 72 is formed above the channel region. P region 74 formed in P-well 66 enables ohmic contact between Schottky metal 50 and P-well 66. Gate 72 is connected to Schottky metal 42.

A P-channel MOSFET is formed by P-type source region 76, P-type drain region 78, and gate 80. Gate 80 is connected to Schottky metal 42. Drain region 70 and drain region 78 are connected together by metal 82 overlying oxide 84. N region 86 enables ohmic contact to be made to epitaxial layer 32 by metal 88, connected to $V_{cc}$.

Schottky diodes DS1 and DS2 act to protect the gate oxide under gates 72 and 80 in the manner described with respect to FIGS. 2 and 3. Schottky diode DS1 effectively bypasses the gate oxide of both MOSFETS upon application of a positive or negative ESD spike on terminal 40, thus avoiding damage to the gate oxide.

Schottky metal 42 and 50 can be formed during a conventional metallization step and thus require no additional process steps.

The P and N channel MOSFETS in FIG. 4 may instead be any FET or bipolar device.

Since in the embodiments of FIGS. 3 and 4, the metal Schottky diodes are formed by metal alloying and crystal regrowth directly to the silicon surface, a significant space savings results, as compared to a given equivalent PN or NP diode junction size.

Also, in some technologies, forming a suitable PN or NP junction requires extra masking and diffusion steps. Thus, the inventive concepts described above are particularly useful when formed using those technologies.

Additionally, in some cases, two additional diffusions are required to form conventional diode junctions for a protective circuit, while protecting against minority carrier injection into the substrate or to prevent a PNP, NPN, or four-layer diode problem. Because of the characteristics of Schottky diodes, these effects are minimized.

The Schottky diodes of this invention are easily formed compared to methods used to form conventional diodes.

Because the forward diode drop of a Schottky diode is several tens of a volt lower than the forward drop of a silicon junction, the Schottky diodes' conduction will prevent the turn-on of any parallel silicon junction diodes, thus avoiding the unwanted injection effects previously mentioned. In the implementation of the circuits of FIGS. 2-4, this phenomenon is observed. Using the above-described inventive techniques, no additional processing is required to protect against these unwanted effects of minority carrier injection, since the Schottky diodes already provide such protection.

Although the present invention has been described in detail, the description is only an illustration of particular applications of the invention and should not be taken as a limitation. The scope of the present invention is defined only by the following claims.

What is claimed is:

1. A circuit formed in a semiconductor substrate for protecting against electrostatic discharge comprising:
   a resistive element having a first terminal and second terminal, said first terminal being connected to an input pad of an integrated circuit;
   a first Schottky diode having an anode and a cathode, said cathode for being connected to a supply voltage, said anode for being connected to said second terminal of said resistive element; and
   a second Schottky diode having an anode and a cathode, said cathode of said second Schottky diode being connected to said cathode of said first Schottky diode, said anode of said second Schottky diode for being connected to a reference voltage.

2. The circuit of claim 1, wherein said anode of said first Schottky diode is connected to a gate of an N-channel MOSFET formed in said semiconductor substrate and said anode of said second Schottky diode overlies a source region of said N-channel MOSFET.

3. The circuit of claim 2 wherein said anode of said first Schottky diode is connected to a gate of a P-channel MOSFET formed in said semiconductor substrate.

4. The circuit of claim 1, wherein said cathode of said first Schottky diode and said cathode of said second Schottky diode share a common N-type semiconductor region.

5. A semiconductor structure comprising:
   an N-type substrate for connection to a supply voltage;
   a resistive region formed in said substrate;
   an input pad connected to a first end of said resistive region;
   a first insulating region formed adjacent to a second end of said resistive region;
   a first Schottky diode having a metal anode overlying said substrate, said metal anode also overlying said first insulating region and overlying said second end of said resistive region;
   a second Schottky diode having a metal anode overlying said substrate, said metal anode for being connected to a reference voltage; and
   one or more transistors having control terminals connected to said anode of said first Schottky diode.

6. The structure of claim 4 wherein said one or more transistors comprise a CMOS device, and said anode of said second Schottky diode overlies a source region of an N-channel MOSFET within said CMOS device.

* * * * *